United States Patent [19]

Meakin et al.

[11] Patent Number: 4,880,753
[45] Date of Patent: Nov. 14, 1989

[54] METHOD OF FABRICATING A POLYSILICON THIN FILM TRANSISTOR

[75] Inventors: Douglas B. Meakin, Liverpool; Piero Migliorato, London, both of England

[73] Assignee: The General Electric Company, p.l.c., England

[21] Appl. No.: 311,219

[22] Filed: Feb. 16, 1989

[30] Foreign Application Priority Data

Feb. 19, 1988 [GB] United Kingdom ............... 8803924

[51] Int. Cl.$^4$ ........................................... H01L 21/265
[52] U.S. Cl. ..................................... 437/41; 437/200; 437/192; 357/23.7; 148/DIG. 147
[58] Field of Search ................. 437/41, 192, 200; 357/23.7, 23.1, 71, 23.8; 148/DIG. 147

[56] References Cited

U.S. PATENT DOCUMENTS

| | | | |
|---|---|---|---|
| 4,631,563 | 12/1986 | Iizuka | 357/23.1 |
| 4,675,713 | 6/1987 | Terry et al. | 357/23.8 |
| 4,727,044 | 2/1988 | Yamazaki | 357/23.7 |
| 4,755,865 | 7/1988 | Wilson et al. | 357/23.7 |
| 4,772,927 | 9/1988 | Saito et al. | 357/23.7 |
| 4,814,842 | 3/1989 | Nakagawa et al. | 357/23.7 |
| 4,823,180 | 4/1989 | Wieder et al. | 357/23.7 |

FOREIGN PATENT DOCUMENTS 0178562 10/1983 Japan ................................. 357/23.7

Primary Examiner—Brian E. Hearn
Assistant Examiner—M. Wilczewski
Attorney, Agent, or Firm—Kirschstein, Ottinger, Israel & Schiffmiller

[57] ABSTRACT

In a process for manufacturing a thin film transistor, a first polysilicon layer is formed on a substrate and a silicon dioxide layer is formed on a region of the first polysilicon layer leaving exposed regions of that layer. A second polysilicon layer is formed on the silicon dioxide layer and aligned therewith. Regions of a selectively-grown electrically-conductive film are deposited on the second polysilicon layer and on the exposed regions of the first polysilicon layer, the film being such that it wil not grow on the edges of the silicon dioxide layer, but will grow on the exposed polysilicon to form gate, source and drain electrodes. The edges of the silicon dioxide layer therefore remain uncoated. The film may be formed of tungsten or may be formed, for example, by selective silicon epitaxy, phosphorus doped.

5 Claims, 2 Drawing Sheets

METHOD OF FABRICATING A POLYSILICON THIN FILM TRANSISTOR

BACKGROUND OF THE INVENTION

1. Field of the Invention

This invention relates to the manufacture of thin film transistors (TFTs) by the deposition of polysilicon.

2. Description of the Related Art

FIG. 1 of the accompanying drawings illustrates the first steps in a well-known process for the formation of a polysilicon TFT. Firstly, a layer (FIG. 1(a)) of silicon dioxide is deposited on a glass substrate 2. A layer 3 of polysilicon is then formed over a region of the silicon dioxide layer. A further area 4 (FIG. 1(b)) of silicon dioxide is formed on the layer 3, and a gate region 5 of polysilicon is formed in alignment with the area 4. The gate region 5 and regions 6 and 7 of the layer 3 projecting beyond the gate region are then doped (FIG. 1(c)) by ion implantation to form gate, source and drain regions respectively, of n+ polysilicon. Contact layers (not shown) are subsequently formed over the regions. During the ion implantation process, the gate region 5 acts as a mask, which should prevent doping of the central region 8 of the layer 3. However, unless very careful control over the ion implantation process is maintained, the doped regions 6 and 7 will extend underneath the gate region 5, forming parasitic capacitances between the gate and the source and between the gate and the drain. The capacitances will reduce the speed of operation of the device.

Furthermore, the ion implantation process accounts for a major part of the cost of forming the device. Moreover, ion implantation is not suitable for the production of TFTs over a large area.

In an alternative known process, (not shown), the lower silicon dioxide layer is covered with a mask having apertures through which doped source and drain regions similar to the regions 6 and 7 are deposited. A layer of polysilicon is formed over those regions, followed by a silicon dioxide layer. A gate region similar to the region 5 is then formed centrally on the silicon dioxide layer. There is a considerable likelihood that the gate region will overlap the edges of the source and drain regions, and parasitic capacitances such as mentioned above will result.

SUMMARY OF THE INVENTION

It is an object of the present invention to provide a process for manufacturing polysilicon TFTs which does not involve the use of ion implantation to produce the conductive regions, and in which the production of the above-mentioned parasitic capacitances is avoided.

According to the invention there is provided a process for manufacturing a thin film transistor, including the steps of forming a first polysilicon layer on a substrate; forming a silicon dioxide layer on a region of the first polysilicon layer leaving exposed regions of said first polysilicon layer; forming a second polysilicon layer on the silicon dioxide layer and aligned therewith; and depositing on the second polysilicon layer and on the exposed regions of the first polysilicon layer, regions of a selectively-grown electrically-conductive film, which film will not grow on the edges of the silicon dioxide layer but will grow on the exposed polysilicon.

Preferably the electrically-conductive film is formed of tungsten.

BRIEF DESCRIPTION OF THE DRAWINGS

An embodiment of the invention will now be described, by way of example, with reference to the accompanying drawings, in which.

DETAILED DESCRIPTION OF THE PREFERRED EMBODIMENT

Figure 1A:
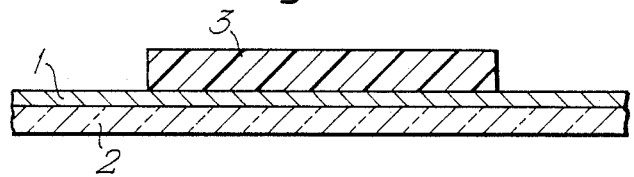
FIG. 1 illustrates steps in a known TFT manufacturing process as described hereinbefore.
Figure 1B:
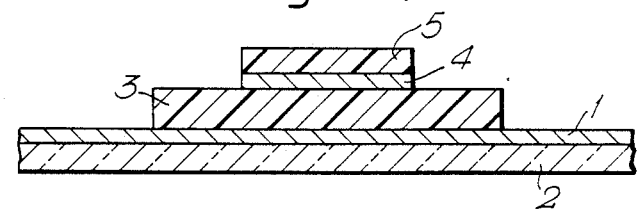
Figure 1C:
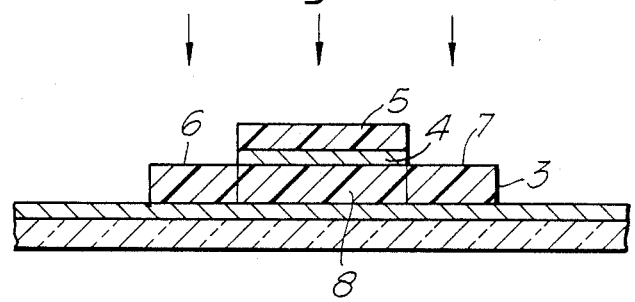
Figure 2A:
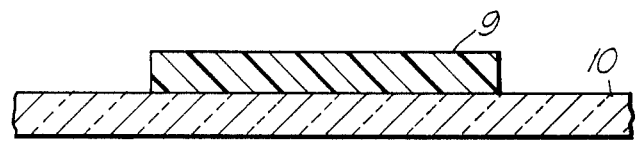
FIG. 2 illustrates corresponding steps in a process in accordance with the invention.
Figure 2B:
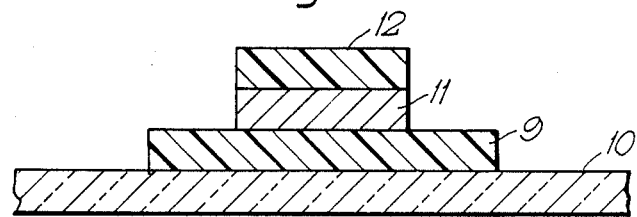
Figure 2C:
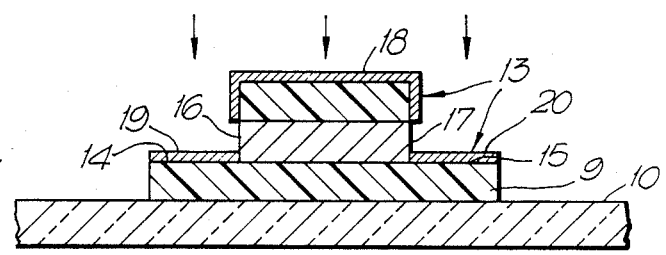

Referring to FIG. 2(a), a layer 9 of polysilicon is formed on a substrate 10. A layer 11 (FIG. 2(b)) of silicon dioxide is formed over a region of the layer 9, and a layer 12 of polysilicon is formed over the layer 11 and in alignment therewith. The device is then heated in a chemical vapour deposition chamber so that a substrate temperature of around 350°–450° C. is achieved. Tungsten hexafluoride is introduced into the chamber. A conductive layer 13 (FIG. 2(c)) of tungsten is thereby selectively-grown (or deposited) on the layer 12 and on the exposed regions 14 and 15 of the layer 9. It is found, however, that the film 13 does not grow on the edges 16, 17 of the silicon dioxide film, which therefore remain uncoated.

The film therefore forms a conductive gate electrode 18 and conductive source and drain electrodes 19, 20 which are isolated from each other and the edges of which would be exactly aligned with each other if it were not for the portion of the layer 13 on the vertical edges of the layer 12. However, that layer is extremely thin, so that there is no appreciable overlapping of the regions to constitute the above-mentioned parasitic capacitances.

Figure 2D:
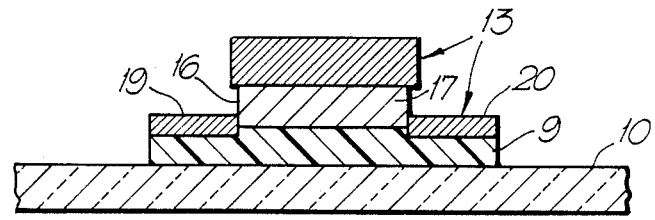

The device can be subsequently heated to cause the tungsten to diffuse into the upper surfaces of the polysilicon layers 9 and 12, as shown in FIG. 2(d).

Although deposition of tungsten by chemical vapour depsition technique is described above, any conductive material may be deposited by any method in which the material will grow on the polysilicon but not on the edges of the silicon dioxide layer. For example, selective silicon epitaxy, phosphorus-doped, may be used.

It will be apparant that the expensive conventional ion implantation process is not required in the process of the present invention.

We claim:

1. A process for manufacturing a thin film transistor, including the steps of forming a first polysilicon layer on a substrate; forming a silicon dioxide layer on a region of said first polysilicon layer leaving exposed regions of said first polysilicon layer; forming a second polysilicon layer on said silicon dioxide layer and aligned therewith; and depositing on said second polysilicon layer and on said exposed regions of said first polysilicon layer, regions of a selectively-grown electrically-conductive film, which film will not grow on the edges of said silicon dioxide layer but will grow on said exposed polysilicon, said selectively-grown regions acting as source and drain regions and gate electrode of the thin film transistor.

2. A process as claimed in claim 1, wherein said electrically-conductive film is a layer of tungsten.

3. A process as claimed in claim 2, wherein said deposition step comprises introducing tungsten hexafluoride gas into an evacuated chamber containing the substrate with the polysilicon and silicon dioxide layers thereon.

4. A process as claimed in claim 3, wherein during said deposition step the temperature of said substrate is maintained in the range of 350° to 450° C.

5. A process as claimed in claim 1, wherein after deposition of the film, the substrate with said layers and said film thereon is heated to cause diffusion of the material of the film into the regions of the first polysilicon layer and into the second polysilicon layer.

* * * * *